United States Patent
Uochi et al.

[11] Patent Number: 6,028,326
[45] Date of Patent: Feb. 22, 2000

[54] THIN FILM TRANSISTOR INCLUDING A CATALYTIC ELEMENT FOR PROMOTING CRYSTALLIZATION OF A SEMICONDUCTOR FILM

[75] Inventors: Hideki Uochi; Yasuhiko Takemura, both of Kanagawa, Japan

[73] Assignee: Semiconductor Energy Laboratory Co., Ltd., Japan

[21] Appl. No.: 08/881,257

[22] Filed: Jun. 24, 1997

Related U.S. Application Data

[60] Continuation of application No. 08/462,744, Jun. 5, 1995, abandoned, which is a division of application No. 08/210,764, Mar. 21, 1994.

[30] Foreign Application Priority Data

Mar. 22, 1993 [JP] Japan ........................................ 5-86748
Feb. 23, 1994 [JP] Japan ........................................ 6-51236

[51] Int. Cl.[7] .......................... H01L 29/76; H01L 31/036; H01L 31/112; H01L 31/0376
[52] U.S. Cl. ............................. 257/66; 257/57; 257/344; 257/335
[58] Field of Search .................................. 257/52, 57, 58, 257/61, 62, 64, 66, 344, 335

[56] References Cited

U.S. PATENT DOCUMENTS

| | | |
|---|---|---|
| 4,231,809 | 11/1980 | Schmidt . |
| 4,746,628 | 5/1988 | Takafugi et al. ............... 437/160 |
| 5,112,764 | 5/1992 | Mitra et al. ............... 437/40 TFT |
| 5,147,826 | 9/1992 | Lui et al. . |
| 5,254,480 | 10/1993 | Tran . |
| 5,262,654 | 11/1993 | Yamazaki . |
| 5,275,851 | 1/1994 | Fonash et al. ............... 427/578 |
| 5,306,651 | 4/1994 | Masumo et al. ............... 437/40 |
| 5,308,998 | 5/1994 | Yamazaki et al. ............... 257/57 |
| 5,403,772 | 4/1995 | Zhang et al. ............... 437/101 |
| 5,508,533 | 4/1996 | Takemura ............... 257/65 |
| 5,531,182 | 7/1996 | Yonehara ............... 437/109 |
| 5,534,716 | 7/1996 | Takemura ............... 257/72 |
| 5,563,426 | 10/1996 | Zhang et al. ............... 257/66 |
| 5,576,556 | 11/1996 | Takemura et al. ............... 257/69 |
| 5,614,733 | 3/1997 | Zhang et al. ............... 257/66 |
| 5,619,044 | 4/1997 | Makita et al. ............... 257/64 |
| 5,696,003 | 12/1997 | Makita et al. ............... 437/21 |

FOREIGN PATENT DOCUMENTS

| | | |
|---|---|---|
| 2-140915 | 5/1990 | Japan . |
| 6-267978 | 12/1994 | Japan . |
| 6-267979 | 12/1994 | Japan . |
| 6-267980 | 12/1994 | Japan . |
| 6-268212 | 12/1994 | Japan . |
| 6-333951 | 12/1994 | Japan . |

OTHER PUBLICATIONS

T. Hempel et al., "Needle–Like Crystallization of Ni Doped Amorphous Silicon Thin Films", *Solid State Communications*, vol. 85, No. 11, pp. 921–924, 1993.

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

C. Hayzelden et al., "In Situ Transmission Electron Microscopy Studies of Silicide–Mediated Crystallization of Amorphous Silicon" (3 pages).

(List continued on next page.)

*Primary Examiner*—Olik Chaudhuri
*Assistant Examiner*—Howard Weiss
*Attorney, Agent, or Firm*—Sixbey, Friendman, Leedom & Ferguson, PC; Jeffrey L. Costellia

[57] ABSTRACT

A crystalline silicon thin film transistor having an LDD (lightly doped drain) structure and a process for fabricating the same, which comprises introducing a catalyst element for accelerating crystallization at a concentration of $1\times10^{15}$ cm$^{-3}$ or more but less than $2\times10^{19}$ cm$^{-3}$ to the impurity region in an amorphous silicon film, crystallizing the amorphous film thereafter, and after forming gate electrode and gate insulating film, implanting an impurity in a self-aligned manner to establish an LDD structure.

39 Claims, 2 Drawing Sheets

OTHER PUBLICATIONS

T. Hempel et al., "Solid State Communications", vol. 85, #11, pp. 921–924, Mar. 1993 (Received after Mar. 22, 1993).

A.V. Dvjrechenskii et al., "Physica Status Solidi", A95, 635 (1986).

Kawazu, Y, H. Kudo, S. Onari, T. Arai, Low–Temperature Crystallization of Hydrogenated Amorphous Silicon Induced by Nickel Silicide Formation; J. J. Appl. Phys., V.29, N4, pp. 2698–2704 Dec., 1990.

R.C. Cammarata et al., Appl. Phys. Lett., 51, 14 (1987) 1106 ". . . Ni Implanted Si Films".

Y.N. Erokhin et al., Appl. Phys. Lett., 63, 23 (1993) 3173 "Spatially Confined $NiSi_2$ Formation at 400° C. . . . ".

Y. Wada et al., J. Electrochem. Soc., 125(9)(1978)1499, "Grain Growth Mechanism of Heavily Doped Phosphorus–Implanted Polysilicon".

S.W. Lee et al., AM–LCD '95 Proceedings, p. 113, "Low Temperature Polys–Si TFT Fabrication by Nickel–Induced Lateral Crystallization of Amorphous Silicon Films".

"Crystallized Si Films By Low–Temperature Rapid Thermal Annealing of Amorphous Silicon", R. Kakkad, J. Smith, W.S. Lau, S.J. Fonash, J. Appl. Phys. 65 (5), Mar. 1, 1989, 1989 American Institute of Physics, pp. 2069–2072.

"Polycrystalline Silicon Thin Film Transistors on Corning 7059 Glass Substrates Using Short Time, Low Temperature Processing", G. Liu, S.J. Fonash, Appl. Phys. Lett. 62 (20), May 17, 1993, 1993 American Institute of Physics, pp. 2554–2556.

"Selective Area Crystallization of Amorphous Silicon Films by Low–Temperature Rapid Thermal Annealing", Gang Liu and S.J. Fonash, Appl. Phys. Lett. 55 (7), Aug. 14, 1989, 1989 American Institute of Physics, pp. 660–662.

"Low Temperature Selective Crystallization of Amorphous Silicon", R. Kakkad, G. Liu, S.J. Fonash, Journal of Non–Crystalline Solids, vol. 115, (1989), pp. 66–68.

THIN FILM TRANSISTOR INCLUDING A CATALYTIC ELEMENT FOR PROMOTING CRYSTALLIZATION OF A SEMICONDUCTOR FILM

This application is a Continuation of Ser. No. 08/462,744, filed Jun. 5, 1995, now abandoned; which itself a division of Ser. No. 08/210,764, filed Mar. 21, 1994.

BACKGROUND OF THE INVENTION

1. Field of the Invention

The present invention relates to a thin film transistor (TFT) comprising a thin film of a non-single crystal semiconductor, and to a process for fabricating the same. The thin film transistor according to the present invention can be formed on either an insulator substrate such as a glass substrate or a semiconductor substrate such as a single crystal silicon. In particular, the present invention relates to a thin film transistor fabricated through the steps of crystallization and activation by thermal annealing.

2. Prior Art

Recently, active study is made on semiconductor devices of insulated-gate type comprising an insulator substrate having thereon a thin film active layer (which is sometimes referred to as "active region"). In particular, much effort is paid on the study of insulated-gate transistors of thin film type, i.e., the so-called thin film transistors (TFTs). The TFTs can be classified into, for example, amorphous silicon TFTs and crystalline silicon TFTs, according to the material and the state of the semiconductor employed in the TFT. The term "crystalline silicon" refers to non-single crystal silicon, which encompasses all types of crystalline silicon except single crystal silicon.

In general, semiconductors in an amorphous state have a low electric field mobility. Accordingly, they cannot be employed in TFTs intended for high speed operation. Furthermore, the electric field mobility of a P-type amorphous silicon is extremely low. This makes the fabrication of a P-channel TFT (a PMOS TFT) unfeasible. It is therefore difficult to obtain a complementary MOS (CMOS) circuit from such a P-channel TFT, because the implementation of a CMOS circuit requires combining a P-channel TFT with an N-channel TFT (NMOS TFT).

In contrast to the amorphous semiconductors, crystalline semiconductors have higher electric field mobilities, and are therefore suitable for use in TFTs designed for high speed operation. Crystalline silicon is further advantageous in that a CMOS circuit can be easily fabricated therefrom, because not only an NMOS TFT but also a PMOS TFT is available from crystalline silicon. Furthermore, it is pointed out that further improved characteristics can be obtained by establishing an LDD (lightly doped drain) structure known in the conventional single crystal semiconductor MOS ICs.

An LDD structure can be obtained by the following process steps:

forming island-like semiconductor regions and a gate insulating film;

forming a gate electrode;

introducing impurities at a low concentration by ion implantation or ion doping;

forming masks for the LDD region (by anisotropic etching of the insulating film covering the gate electrode, or by selective oxidation of the anodic oxide covering the gate electrode);

introducing impurities at high concentration by ion implantation or ion doping; and annealing the impurities.

The most problematic in the above process is the sixth step, in which the amorphous silicon is activated by laser annealing or by thermal annealing. Laser annealing comprises irradiating a laser beam or an intense light having an intensity equivalent to that of a laser beam. However, laser annealing is not suitable for mass production, because the laser beam output is still unstable and because the beam is applied for an extremely short period of time. Furthermore, the laser beam is irradiated from the upper side of the gate electrode. It then results in an insufficiently activated LDD region, because the mask formed in the fourth step functions as a shield.

A practical process at present is thermal annealing, which comprises activating the impurities in silicon by heating. The LDD region can be sufficiently activated, and uniform batches can be realized by this process. However, in general, the impurities in the silicon film must be activated by annealing for a long period of time at about 600° C., or by annealing at a high temperature of 1,000° C. or even higher. The latter method, i.e., the high temperature annealing can be applied only to cases using quartz substrates, and the use of such expensive substrates considerably increases the production cost. The former process can be applied to a wide variety of substrates. However, the use of inexpensive substrates brings about other problems such as the shrinking of substrates during thermal annealing, because it leads to a low product yield due to the failure upon mask matching. It is therefore necessary to effect treatments at lower temperatures when such inexpensive substrates are used. More specifically, thermal treatments are preferably performed at temperatures not higher than the deformation temperature of alkali-free glass generally used in the substrates, and more preferably, at a temperature lower than the deformation temperature by 50 degrees or more.

The present invention provides a solution to the aforementioned problems difficult to solve.

SUMMARY OF THE INVENTION

As a result of an extensive study of the present inventors, it has been found that the crystallization of a substantially amorphous silicon film can be accelerated by adding a trace amount of a catalyst material. In this manner, the crystallization can be effected at a lower temperature and in a shorter duration of time. Preferred catalyst materials include pure metals, i.e., nickel (Ni), iron (Fe), cobalt (Co), and platinum (Pt), or a compound such as a silicide of an element enumerated herein. More specifically, the process according to the present invention comprises bringing the catalyst elements or a compound thereof as they are or in the form of a coating in contact with amorphous silicon, or introducing the catalyst elements into the amorphous silicon film by ion implantation and the like, and then, thermally annealing the resulting structure at a proper temperature, typically at 580° C. or lower.

Naturally, the duration of crystallization can be shortened by increasing the annealing temperature. Furthermore, the duration of crystallization becomes shorter and the crystallization temperature becomes lower with increasing concentration of nickel, iron, cobalt, or platinum. The present inventors have found, through an extensive study, that the crystallization is accelerated by incorporating at least one of the catalytic elements above at a concentration higher than $1\times10^{15}$ cm$^{-3}$, and preferably, at a concentration of $5\times10^{18}$ cm$^{-3}$ or higher.

The catalyst materials enumerated above, however, are not favorable for silicon. Accordingly, the concentration thereof are preferably controlled to a level as low as possible. The present inventors have found through the study that the preferred range of the concentration in total is $2 \times 10^{19}$ cm$^{-3}$ or lower.

DETAILED DESCRIPTION OF THE PREFERRED EMBODIMENTS

Figure 1A:
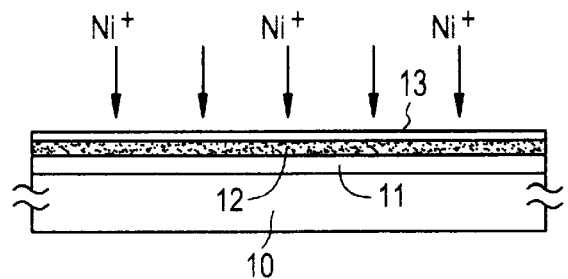
FIGS. 1(A) to 1(E) show schematically drawn step sequential cross section structures obtained in a process according to an embodiment of the present invention (Example 1)

As described in the summary, the present inventors have notified the effect of the catalyst element, and have found that the problems of the prior art processes can be overcome by taking advantage of these elements. Accordingly, a process for fabricating a TFT according to an embodiment of the present invention comprises introducing the catalyst elements into silicon which had been rendered amorphous to lower the crystallization temperature, thereby lowering the temperature of activating the doped impurity (i.e., the recrystallization temperature). According to the study of the present inventors, in particular, the crystallization was found to proceed extremely rapidly when catalyst elements were introduced inside silicon by means of ion implantation or ion doping to achieve a uniform distribution. Typically, the crystallization and activation were found to be effected at a temperature of 550° C. or lower. Furthermore, annealing was found to be completed sufficiently within 8 hours, and typically, within 4 hours.

Furthermore, the present invention enables the crystallization of thin films having a thickness as thin as 1,000 Å or less in thickness. This was not possible by a conventional thermal annealing. The present invention provides crystallized film thin films having a thickness as thin as 1,000 Å or even less at a low temperature and within a shorter period of time. A TFT having an active region as thin as 1,000 Å or thinner, and particularly, 500 Å or thinner, not only yields excellent device characteristics, but suffers less defects at the stepped portions of gate insulating film and gate electrodes. It can be seen that those TFTs having thin active region are far advantageous in that they can be produced at high yield. Conventionally, however, these TFTs could be produced only by employing laser annealing in the crystallization process. The present invention allows the application of thermal annealing to the technical field which was conventionally dominated by laser annealing, and greatly increases the product yield. It can be understood therefore that the present invention is of importance.

The present invention is illustrated in greater detail referring to non-limiting examples below. It should be understood, however, that the present invention is not to be construed as being limited thereto.

EXAMPLE 1

FIG. 1 shows the cross section view of the step sequential structures obtained by a process according to an embodiment of the present invention. Referring to FIG. 1, a 2,000 Å thick silicon oxide film 11 was formed by sputtering as a base film on a Corning #7059 glass substrate 10. Then, an intrinsic (I-type) amorphous silicon film 12 was deposited thereon by plasma CVD to a thickness of from 500 to 1,500 Å, for example, to a thickness of 1,500 Å, and a 200 Å thick silicon oxide film 13 was further deposited thereon by sputtering. Subsequently, nickel ions were implanted therein by ion implantation at a dose of from $2 \times 10^{13}$ to $2 \times 10^{14}$ cm$^{-2}$, specifically for example, at a dose of $5 \times 10^{13}$ cm$^{-2}$. The resulting amorphous silicon film 12 was found to contain nickel at a concentration of about $5 \times 10^{18}$ cm$^{-3}$. This step can be performed alternatively by adhering a nickel suicide film from 5 to 100 Å in thickness. In such a case, however, the silicon film 13 is preferably not provided. Thus was obtained a structure as shown in FIG. 1(A).

The amorphous silicon film was then crystallized by annealing at 550° C. in nitrogen atmosphere for a duration of 4 hours. After annealing, the silicon film was patterned to form an island-like silicon region 12a, and a 1,000 Å thick silicon oxide film 14 was deposited thereon by sputtering as a gate insulating film. The sputtering process was performed in an atmosphere containing oxygen and argon at an argon to oxygen ratio of not higher than 0.5, for example, at a ratio of 0.1 or lower, using silicon oxide as the target. The temperature of the substrate during the process was maintained in the range of from 200 to 400° C., for example, at 250° C.

Figure 1B:
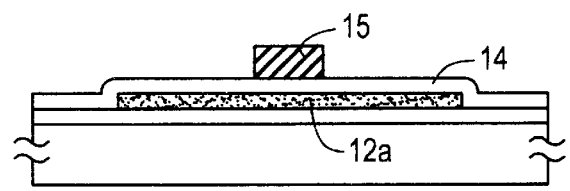

Then, a silicon film containing from 0.1 to 2% of phosphorus was deposited by reduced pressure CVD to a thickness of from 3,000 to 8,000 Å, for example, at a thickness of 6,000 Å. Preferably, the steps of depositing the silicon oxide film and the silicon film are performed continuously. The resulting silicon film was patterned to form a gate electrode 15 as shown in FIG. 1(B).

Figure 1C:
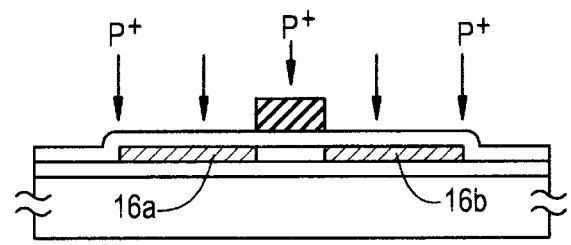

Phosphorus was then introduced as an impurity by plasma doping into the silicon region using the gate electrode as a mask. The doping was performed using phosphine (PH$_3$) as the doping gas, and applying an accelerating voltage in the range of from 60 to 90 kV, for example, at 80 kV, to introduce phosphorus at a dose in the range of from $1 \times 10^{13}$ to $8 \times 10^{13}$ cm$^{-2}$ Phosphorus in this case was incorporated at a dose of $2 \times 10^{13}$ cm$^{-2}$. In this manner, N-type impurity regions 16a and 16b were formed as shown in FIG. 1(C).

Figure 1D:
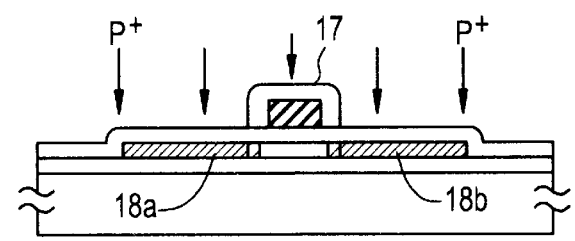

The resulting substrate was immersed into a citric acid solution at a concentration of from 1 to 5%, and electric current was applied to the gate electrode to allow an anodic oxide layer 17 to grow on the surface thereof. The anodic oxide film is preferably grown to a thickness of from 1,000 to 5,000 Å, and particularly preferably, in the thickness range of from 2,000 to 3,000 Å. In this case, the anodic oxide film was formed at a thickness of 2,500 Å. Phosphorus as an impurity was introduced into the silicon region by plasma doping, using the gate electrode and the peripheral anodic oxide as the mask. The doping was performed using phosphine (PH$_3$) as the doping gas, and applying an accelerating voltage in the range of from 60 to 90 kV, for example, at 80 kV, to introduce phosphorus at a dose in the range of from $1 \times 10^{15}$ to $8 \times 10^{15}$ cm$^{-2}$, specifically for example, at a dose of $2 \times 10^{15}$ cm$^{-2}$. In this manner, N-type impurity regions 18a and 18b containing the impurity at high concentration were formed. Furthermore, the previously formed LDD region (lightly doped drain region) was partly left over because the anodic oxide functioned as a mask. Thus was obtained a structure as shown in FIG. 1(D).

The resulting structure was annealed at 500° C. for 4 hours in nitrogen gas atmosphere to activate the impurity. The activation is preferably performed at a temperature lower than that at which the previous crystallization was performed. In this manner, the shrinking of substrate can be suppressed to a level as low as possible. The nickel atoms distributed over the entire silicon film allowed the film to recrystallize rapidly even by a low temperature annealing. The impurity regions 16a, 16b, 18a, and 18b were activated in this manner. It should be noticed here that the LDD regions are sufficiently activated by the thermal annealing process according to the present invention, because this was not possible by a conventional process employing laser annealing. Furthermore, no jump in crystallinity was found between the impurity region and the activated region.

Figure 1E:
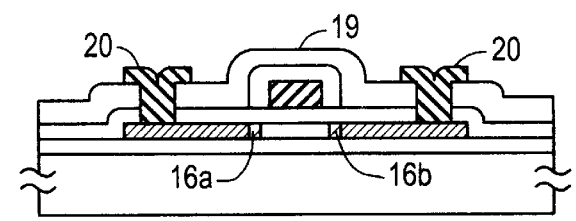

Then, a 6,000 Å thick silicon oxide film 19 was formed as an interlayer insulator by plasma CVD, and contact holes were formed therein to establish electrodes with interconnections 20 for the source and the drain regions of the TFT, using a multilayered film comprising metallic materials, such as titanium nitride and aluminum. The resulting structure was annealed at 350° C. for 30 minutes in hydrogen atmosphere under a pressure of 1 atm. Thus was implemented a complete thin film transistor as shown in FIG. 1(E).

The nickel concentration of the impurity region and the active region of the TFT thus obtained was measured by means of secondary ion mass spectroscopy (SIMS). The impurity region was found to contain nickel at a concentration of from $1\times10^{18}$ to $5\times10^{18}$ $cm^{-3}$.

EXAMPLE 2

FIG. 2 shows the cross section view of the step sequential structures obtained by a process according to an embodiment of the present invention. Referring to FIG. 2, a 2,000 Å thick silicon oxide film 22 was formed by sputtering as a base film on a Corning #7059 glass substrate 21. Then, an intrinsic (I-type) amorphous silicon film was deposited thereon by plasma CVD to a thickness of from 500 to 1,500 Å, for example, to a thickness of 500 Å, and was patterned to form an island-like silicon region 23.

Then, a 1,000 Å thick silicon oxide film 24 was deposited as a gate insulating film by plasma CVD using tetraethoxysilane (TEOS; $Si(OC_2H_5)_4$) and oxygen as the starting materials. Trichloroethylene ($C_2HCl_3$) was also added into the starting gas material. Oxygen gas was flown into the chamber at a rate of 400 sccm (standard cubic centimeters per minute) before initiating the film deposition, and plasma was generated inside the chamber while maintaining the chamber at a total pressure 5 Pa and the substrate at a temperature to 300° C., and applying an RF power of 150 W. This state was held for a duration of 10 minutes. Then, silicon oxide film was deposited by introducing oxygen, TEOS, and trichloroethylene into the chamber at a flow rate of 300 sccm, 15 sccm, and 2 sccm, respectively. The substrate temperature, RF power, and the total pressure during the film deposition were maintained at 300° C., 75 W, and 5 Pa, respectively. Upon completion of film deposition, hydrogen gas was introduced into the chamber at such an amount to control the pressure to 100 Torr, to effect hydrogen annealing at 350° C. for 35 minutes.

Figure 2A:
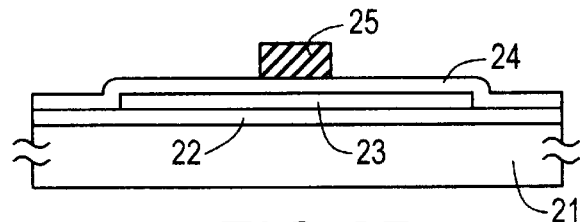
FIGS. 2(A) to 2(E) show schematically drawn step sequential cross section structures obtained in another process according to another embodiment of the present invention (Example 2).

Subsequently, a tantalum film was deposited by sputtering at a thickness of from 3,000 to 8,000 Å, for example, at a thickness of 6,000 Å. Titanium, tungsten, molybdenum, or silicon can be used in the place of tantalum. However, the film must have sufficiently high heat resistance to resist against the later activation treatment. Preferably, the deposition steps of the silicon oxide film 24 and the tantalum film are performed continuously. The tantalum film was patterned to form a gate electrode 26 having a width (channel length) of from 5 to 20 μm for the TFT. Thus was obtained a structure as shown in FIG. 2(A).

Figure 2B:
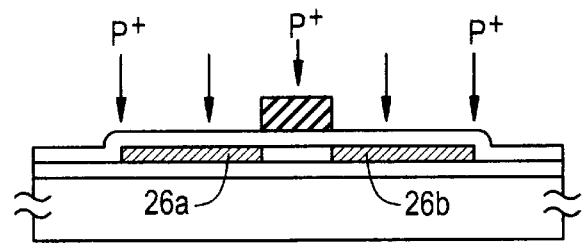

Phosphorus as an impurity was implanted into the silicon region thereafter by plasma doping using the gate electrode as the mask. The doping process was performed using phosphine ($PH_3$) as the doping gas and applying an accelerating voltage of 80 kV. Phosphorus in this case was incorporated at a dose of $2\times10^{13}$ $cm^{-2}$. In this manner, N-type impurity regions 26a and 26b were formed as shown in FIG. 2(B).

Figure 2C:
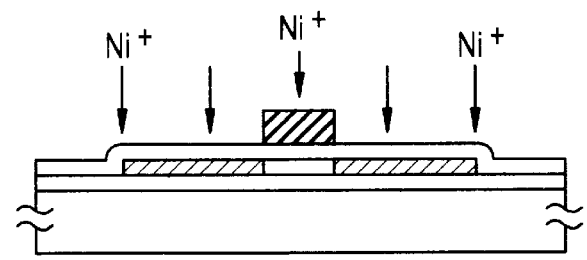

Then, nickel ions were implanted by ion doping using the gate electrode as a mask. Nickel was introduced at a dose in the range of from $2\times10^{13}$ to $2\times10^{14}$ $cm^{-2}$, more specifically, at a dose of $1\times10^{14}$ $cm^{-2}$, for example. As a result, the concentration of nickel in the amorphous silicon region 23 was found to be about $1\times10^{19}$ $cm^{-3}$. Thus was obtained a structure as shown in FIG. 2(C).

Figure 2D:
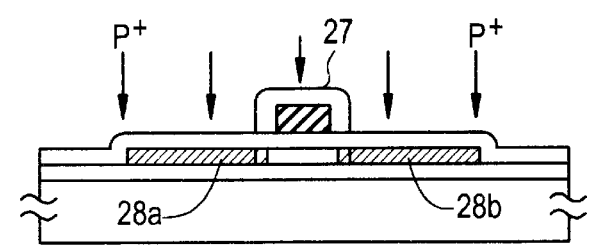

The surface of the tantalum interconnection was subjected to anodic oxidation to form an oxide layer 27 on the surface thereof. The anodic oxidation was performed in an ethylene glycol solution containing from 1 to 5% of tartaric acid. Thus was obtained an oxide layer 2,000 Å in thickness. Phosphorus as an impurity was implanted into the silicon region thereafter again by ion implantation using the gate electrode as the mask. The doping process was performed by applying an accelerating voltage of 80 kV. Phosphorus in this case was incorporated at a dose of $2\times10^{15}$ $cm^{-2}$. In this manner, N-type impurity regions 28a and 28b containing the impurity at high concentration were formed as shown in FIG. 2(D).

The resulting structure was annealed at 500° C. for 4 hours in nitrogen gas atmosphere to crystallize the amorphous silicon film and to activate the impurity. Since nickel is implanted in the N-type impurity regions 28a and 28b as well as in 26a and 26b, the activation was found to proceed easily by the annealing. No nickel was implanted into the active region under the gate electrode, however, crystallization proceeded because nickel diffused from the impurity region 26. A complete crystallization was found to occur on a channel 10 μm or less in length. However, it was found difficult to achieve complete crystallization on a channel exceeding 10 μm in length. By elevating the temperature of annealing to 550° C., crystallization was found to occur even on a channel 20 μm in length. Accordingly, it was found that crystallization along the transverse direction can be accelerated by elevating the annealing temperature or by increasing the duration of annealing.

Figure 2E:
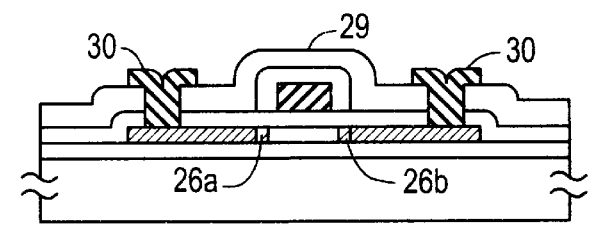

Then, a 2,000 Å thick silicon oxide film 29 was formed as an interlayer insulator by plasma CVD using TEOS as the material, and contact holes were formed therein to establish electrodes with interconnections 30 for the source and the drain regions of the TFT, using a multilayered film comprising metallic materials, such as titanium nitride and aluminum. Thus was implemented a complete thin film transistor as shown in FIG. 2(E).

The thin film transistor thus fabricated was found to yield an electric field mobility in the range of from 70 to 100 $cm^2/Vs$ at a gate voltage of 10 V, a threshold voltage of from 2.5 to 4.0 V, and a leak current of $10^{-13}$ A or lower upon applying a voltage of −20 V.

The process according to the present invention comprises effecting the crystallization of the amorphous silicon film and the activation of the doped impurities within such a short duration of 4 hours and at a low temperature in the range of from 500 to 550° C. In this manner, the throughput can be considerably increased. Furthermore, the process according to the present invention provides a solution to the conventional problem frequently encountered in processes effected at temperatures not lower than 600° C.; i.e., the low product yield attributed to the shrinking of glass substrates.

The above fact signifies that the process according to the present invention allows treating large-area substrates at one time. In other words, the unit cost of a semiconductor circuit (e.g., a matrix circuit) can be considerably lowered by cutting out many substrates from a single large-area substrate treated at one time. It can be seen that the present invention is suitable for mass production, and that it provides devices of improved characteristics.

Among the two examples described herein, particularly the process of the second example is noticeable in that the crystallization of the amorphous silicon film and the activation of the impurities are effected simultaneously. In prior art processes, the activation of the impurities was generally performed after introducing the impurities in a manner similar to that described in Example 1. However, those conventional processes effecting the crystallization and the activation in two steps were not preferred. Not only the steps are doubled, but also a discontinuity of crystal growth generates between the active region formed in the first crystallization step and the source and drain which were recrystallized after introducing the impurities. Such a discontinuity in crystals considerably impaired the device reliability.

It can be seen from the foregoing description that the process according to an embodiment of the present invention, which comprises effecting the crystallization and the activation at the same time is effective not only because it simplifies the process and increases the throughput accordingly, but also because it improves the device reliability by providing crystals having favorable crystallinity. Conclusively, the present invention is greatly contributory to the industry.

While the invention has been described in detail and with reference to specific embodiments thereof, it will be apparent to one skilled in the art that various changes and modifications can be made therein without departing from the spirit and scope thereof.

What is claimed is:

1. A transistor comprising:
   a crystalline semiconductor film;
   a gate electrode provided adjacent to said semiconductor film;
   a source and a drain provided in said semiconductor film;
   an active region provided between said source and said drain; and
   a lightly doped region provided in said crystalline semiconductor film between said active region and at least one of said source and said drain,
   wherein a catalytic element is contained at least in said lightly doped region, and concentration of said catalytic element is not higher than $2\times10^{19}$ cm$^{-3}$ at least in said lightly doped region.

2. The transistor of claim 1 wherein said concentration is measured by secondary ion mass spectroscopy.

3. The transistor of claim 1 wherein said semiconductor film is in the form of an island.

4. The transistor of claim 3 wherein said semiconductor film has a thickness of 1000 Å or less.

5. The transistor of claim 1 wherein said active region comprises a channel having a channel length of 10 μm or shorter.

6. The transistor of claim 1 wherein said lightly doped region contains a doping impurity at a concentration higher than said active region and lower than said at least one of said source and said drain.

7. A thin film transistor comprising:
   a substrate having an insulating surface;
   a crystalline semiconductor film formed on the insulating surface; and
   a gate electrode formed adjacent to the semiconductor film with an insulating film therebetween,
   wherein the semiconductor film comprises,
       source and drain regions,
       an active layer located between the source and drain regions; and
       lightly doped regions located in said crystalline semiconductor film between the source region and the active layer and between the drain region and the active layer,
   wherein a catalytic element is contained at least in said lightly doped regions, and concentration of said catalytic element is not higher than $2\times10^{19}$ cm$^{-3}$ at least in said lightly doped regions.

8. The transistor of claim 7 wherein the lightly doped regions have an impurity concentration higher than the active layer and lower than the source and drain regions.

9. An integrated circuit comprising:
   a substrate having an insulating surface; and
   at least one thin film transistor formed on the insulating surface;
   wherein the thin film transistor comprises,
       a crystalline semiconductor film formed on the insulating surface; and
       a gate electrode formed adjacent to the semiconductor film with an insulating film therebetween, and
   wherein the semiconductor film comprises,
       source and drain regions,
       an active layer located between the source and drain regions; and
       lightly doped regions located in said crystalline semiconductor film between the source region and the active layer and between the drain region and the active layer,
   wherein a catalytic element is contained at least in said lightly doped regions, and concentration of said catalytic element is not higher than $2\times10^{19}$ cm$^{-3}$ at least in said lightly doped regions.

10. The circuit of claim 9 wherein the lightly doped region have an impurity concentration higher than the active layer and lower than the source and drain regions.

11. A thin film transistor comprising:
    a substrate having an insulating surface;
    a crystalline semiconductor film formed on the insulating surface, the crystalline semiconductor film having a thickness of 1000 Å or less;
    a gate electrode formed adjacent to the semiconductor film with an insulating film therebetween,
    wherein the crystalline semiconductor film comprises,
        source and drain regions,
        an active layer located between the source and drain regions; and
        lightly doped regions located in said crystalline semiconductor film between the source region and the active layer and between the drain region and the active layer,
    wherein a catalytic element is contained at least in said lightly doped regions, and concentration of said catalytic element is not higher than $2 \times 10^{19}$ cm$^{-3}$ at least in said lightly doped regions.

12. The transistor of claim 11 wherein the lightly doped region have an impurity concentration higher than the active layer and lower than the source and drain regions.

13. The transistor of claim 1 wherein said catalytic element is selected from the group consisting of nickel, iron, cobalt, platinum, and a silicide thereof.

14. The transistor of claim 7 wherein said catalytic element is selected from the group consisting of nickel, iron, cobalt, platinum, and a silicide thereof.

15. The circuit of claim 9 wherein said catalytic element is selected from the group consisting of nickel, iron, cobalt, platinum, and a silicide thereof.

16. The transistor of claim 11 wherein said catalytic element is selected from the group consisting of nickel, iron, cobalt, platinum, and a silicide thereof.

17. A transistor comprising:
a crystalline semiconductor film provided on a substrate;
a gate electrode provided adjacent to said semiconductor film;
a source and a drain provided in said semiconductor film;
an active region provided between said source and said drain; and
a lightly doped region provided in said crystalline semiconductor film between said active region and at least one of said source and said drain,
wherein said semiconductor film has a thickness of 1000 Å or less, and
wherein a catalytic element is contained at least in said lightly doped region, and concentration of said catalytic element is not higher than $2 \times 10^{19}$ cm$^{-3}$ at least in said lightly doped region.

18. The transistor of claim 1 wherein said gate electrode comprises tantalum and having a thickness of 3000 to 8000 Å.

19. The transistor of claim 7 wherein said gate electrode comprises tantalum and having a thickness of 3000 to 8000 Å.

20. The circuit of claim 9 wherein said gate electrode comprises tantalum and having a thickness of 3000 to 8000 Å.

21. The transistor of claim 11 wherein said gate electrode comprises tantalum and having a thickness of 3000 to 8000 Å.

22. The transistor of claim 17 wherein said gate electrode comprises tantalum and having a thickness of 3000 to 8000 Å.

23. A transistor comprising:
a crystalline semiconductor film;
a gate electrode provided adjacent to said semiconductor film;
a source and drain provided in said semiconductor film;
an active region provided between said source and said drain; and
a lightly doped region provided in said crystalline semiconductor film between said active region and at least one of said source and said drain,
wherein a catalytic element is contained at least in said lightly doped region, and concentration of said catalytic element is not higher than $2 \times 10^{19}$ cm$^{-3}$ at least in said lightly doped region, and
wherein phosphorus is contained in said lightly doped region and said source and said drain.

24. A transistor comprising:
a crystalline semiconductor film;
a gate electrode provided adjacent to said semiconductor film;
a source and drain provided in said semiconductor film;
an active region provided between said source and said drain; and
a lightly doped region provided in said crystalline semiconductor film between said active region and at least one of said source and said drain,
wherein a catalytic element is contained at least in said lightly doped region, and concentration of said catalytic element is not higher than $2 \times 10^{19}$ cm$^{-3}$ at least in said lightly doped region, and
wherein an impurity is doped into said source and said drain using phosphine.

25. A transistor comprising:
a crystalline semiconductor film;
a gate electrode provided adjacent to said semiconductor film;
a pair of heavily doped regions provided in said semiconductor film;
an active region provided between said heavily doped regions; and
a lightly doped region provided in said crystalline semiconductor film between said active region and at least one of said heavily doped regions,
wherein a catalytic element is contained at least in said lightly doped region, and concentration of said catalytic element is not higher than $2 \times 10^{19}$ cm$^{-3}$ at least in said lightly doped region, and
wherein an N-type impurity is contained in said lightly doped region at a concentration lower than in said heavily doped regions.

26. A transistor comprising:
a crystalline semiconductor film;
a gate electrode provided adjacent to said semiconductor film;
a source and a drain provided in said semiconductor film;
an active region provided between said source and said drain; and
a lightly doped region provided in said crystalline semiconductor film between said active region and at least one of said source and said drain,
wherein a catalytic element is contained at least in said lightly doped region, and concentration of said catalytic element is not higher than $2 \times 10^{19}$ cm$^{-3}$ at least in said lightly doped region, and
wherein an N-type impurity is contained in said lightly doped region at a concentration lower than in said source and said drain.

27. A transistor comprising:
a crystalline semiconductor film;
a gate electrode provided adjacent to said semiconductor film, said gate electrode comprising an element selected from the group consisting of titanium, tungsten, molybdenum, silicon and tantalum;
a source and a drain provided in said semiconductor film;
an active region provided between said source and said drain; and
a lightly doped region provided in said crystalline semiconductor film between said active region and at least one of said source and said drain, wherein a catalytic element is contained at least in said lightly doped region, and concentration of said catalytic element is not higher than $2 \times 10^{19}$ cm$^{-3}$ at least in said lightly doped region.

28. The transistor of claim 25 wherein said N-type impurity is phosphorus.

29. The transistor of claim 26 wherein said N-type impurity is phosphorus.

30. The transistor of claim 24 wherein said impurity is doped at a dose of $1 \times 10^{15}$ to $8 \times 10^{15}$ cm$^{-2}$.

31. The transistor of claim 23 wherein said catalytic element is doped at least into said source and said drain at a dose of $2 \times 10^{13}$ to $2 \times 10^{14}$ cm$^{-2}$.

32. The transistor of claim 24 wherein said catalytic element is doped at least into said source and said drain at a dose of $2 \times 10^{13}$ to $2 \times 10^{14}$ cm$^{-2}$.

33. The transistor of claim 25 wherein said catalytic element is doped at least into said heavily doped regions at a dose of $2 \times 10^{13}$ to $2 \times 10^{14}$ cm$^{-2}$.

34. The transistor of claim 26 wherein said catalytic element is doped at least into said source and said drain at a dose of $2 \times 10^{13}$ to $2 \times 10^{14}$ cm$^{-2}$.

35. The transistor of claim 27 wherein said catalytic element is doped at least into said source and said drain at a dose of $2 \times 10^{13}$ to $2 \times 10^{14}$ cm$^{-2}$.

36. The transistor of claim 23 wherein said phosphorus is activated by heating at a temperature of 500° C. for four hours.

37. The transistor of claim 24 wherein said impurity is activated by heating at a temperature of 500° C. for four hours.

38. The transistor of claim 25 wherein said N-type impurity is activated by heating at a temperature of 500° C. or lower for four hours.

39. The transistor of claim 26 wherein said N-type impurity is activated by heating at a temperature of 500° C. for four hours.

* * * * *